United States Patent
Xu

(10) Patent No.: US 12,206,393 B2
(45) Date of Patent: Jan. 21, 2025

(54) CURRENT LIMITING CIRCUIT OF SWITCHING CIRCUIT AND SWITCHING CIRCUIT

(71) Applicant: Joulwatt Technology Co., Ltd., Hangzhou (CN)

(72) Inventor: Xiangyong Xu, Hangzhou (CN)

(73) Assignee: Joulwatt Technology Co., Ltd., Hangzhou (CN)

( * ) Notice: Subject to any disclaimer, the term of this patent is extended or adjusted under 35 U.S.C. 154(b) by 380 days.

(21) Appl. No.: 17/828,045

(22) Filed: May 31, 2022

(65) Prior Publication Data

US 2022/0385283 A1 Dec. 1, 2022

(30) Foreign Application Priority Data

May 31, 2021 (CN) .......................... 202110600543.7

(51) Int. Cl.
| | |
|---|---|
| H03K 17/0812 | (2006.01) |
| H02H 9/04 | (2006.01) |
| H03K 17/687 | (2006.01) |
| H03K 17/74 | (2006.01) |

(52) U.S. Cl.
CPC ....... *H03K 17/08122* (2013.01); *H02H 9/046* (2013.01); *H03K 17/687* (2013.01); *H03K 17/74* (2013.01)

(58) Field of Classification Search
CPC ................................. H03K 17/08122
USPC ......................................... 327/427
See application file for complete search history.

(56) References Cited

U.S. PATENT DOCUMENTS

2010/0271362 A1* 10/2010 Lee .................. H02M 1/44
327/427

* cited by examiner

*Primary Examiner* — Tomi Skibinski
(74) *Attorney, Agent, or Firm* — Bayramoglu Law Offices LLC

(57) ABSTRACT

A current limiting circuit of a switching circuit, and a switching circuit are provided. The switching circuit uses a gallium nitride (GaN) power transistor as a main power transistor. The current limiting circuit includes a first terminal connected with a drain of the GaN power transistor, and a second terminal connected with a controller of the switching circuit. The current limiting circuit is configured to limit a current flowing out of a power supply terminal of the controller. The current limiting circuit suppresses a negative current flowing through the controller.

17 Claims, 3 Drawing Sheets

CURRENT LIMITING CIRCUIT OF SWITCHING CIRCUIT AND SWITCHING CIRCUIT

CROSS REFERENCE TO THE RELATED APPLICATIONS

This application is based upon and claims priority to Chinese Patent Application No. 202110600543.7, filed on May 31, 2021, the entire contents of which are incorporated herein by reference.

TECHNICAL FIELD

The present disclosure relates to the field of power electronics, and in particular, to a current limiting circuit of a switching circuit and a switching circuit.

BACKGROUND

A pulse width modulation (PWM) control chip of a switching circuit can realize high-voltage startup. Generally, there are two high-voltage power obtaining methods. One is to supply power to a high-voltage pin of a chip controller from an alternating current (AC) input terminal through a full wave rectifier circuit, and the other is to obtain power from a direct current (DC) bus capacitor. If the control chip is an integrated power metal-oxide-semiconductor field-effect transistor (MOSFET), as shown in FIG. 1, the pins of the chip itself include a drain pin. In order to omit a high-voltage pin, for the high-voltage startup power obtaining, power is usually taken from the drain pin.

The chip with the integrated power MOSFET can obtain power from the drain pin, but if it is a chip integrated with a gallium nitride (GaN) power transistor, and a power is still obtained directly from the drain pin, there may be a relatively large negative voltage at a drain terminal of the chip, which affects the normal operation of the chip or even damages it. This is because there is an important difference between device characteristics of the GaN power transistor and the power MOSFET: an anti-parallel diode is integrated between a drain terminal and a source terminal of the power MOSFET, while the GaN power transistor does not include such diode. In this case, a voltage drop of the GaN power transistor, when a reverse current flows, is much larger than that of the power MOSFET, thereby causing the above problems.

SUMMARY

An objective of the present disclosure is to provide a current limiting circuit limiting a negative current flowing through a controller of a switching circuit and a switching circuit, which solves the problem in the prior art that the negative current flows through the controller of the switching circuit due to the use of a GaN power transistor, which easily causes damage to the controller.

Based on the above objective, the present disclosure provides a current limiting circuit of a switching circuit. The switching circuit includes a main power transistor and a controller. A power supply terminal of the controller is connected with a drain of the main power transistor. The current limiting circuit includes a first terminal connected with the drain of the main power transistor, and a second terminal connected with the power supply terminal of the controller of the switching circuit.

Optionally, a GaN power transistor may be configured as the main power transistor.

Optionally, the current limiting circuit may include a diode. The diode may include an anode connected with the drain of the main power transistor, and a cathode connected with the power supply terminal of the controller.

Optionally, the current limiting circuit may include a zener diode. The zener diode may include an anode connected with the drain of the main power transistor, and a cathode connected with the power supply terminal of the controller.

Optionally, a breakdown voltage of the zener diode may be greater than an absolute value of a drain-source voltage difference of the main power transistor when a negative current flows through the main power transistor.

Optionally, the current limiting circuit may include a main diode and a plurality of auxiliary diodes. The main diode may include an anode connected with the drain of the main power transistor, and a cathode connected with the power supply terminal of the controller.

The plurality of auxiliary diodes may be connected in anti-parallel with the main diode after the plurality of auxiliary diodes are connected in series.

Optionally, a number of the auxiliary diodes may be determined according to a source-drain voltage of the main power transistor.

Optionally, a total voltage drop of the plurality of auxiliary diodes in series may be greater than an absolute value of a drain-source voltage difference of the main power transistor when a negative current flows through the main power transistor.

Optionally, the current limiting circuit may include a first resistor. The first resistor may include a first terminal connected with the drain of the main power transistor, and a second terminal connected with the power supply terminal of the controller.

The present disclosure further provides a switching circuit, including a main power transistor and a controller. A power supply terminal of the controller is connected with a drain of the main power transistor, and the switching circuit includes the current limiting circuit according to any one of the above items.

Optionally, the main power transistor may be a GaN main power transistor.

Optionally, the main power transistor may be configured as an integrated power chip including the GaN main power transistor and a driver of the GaN main power transistor.

Optionally, a common connection point of the power supply terminal of the controller and the drain of the main power transistor may be connected to a power loop node of the switching circuit.

Compared with the prior art, the present disclosure has the following advantages: by connecting a current limiting circuit between a drain pin of the main power transistor and a high-voltage controller, a negative voltage or negative current flowing to the controller is limited, such that the controller is prevented from bearing a large negative voltage or negative current, thereby avoiding the problem of abnormal operation of the controller.

DETAILED DESCRIPTION OF THE EMBODIMENTS

The preferred embodiments of the present disclosure are described in detail below with reference to the drawings, but the present disclosure is not limited to these embodiments. The present disclosure covers any substitution, modification, equivalent method and solution made within the spirit and scope of the present disclosure.

For a better understanding of the present disclosure, the specific details of the following preferred embodiments of the present disclosure are explained hereinafter in detail, while the present disclosure can also be fully understood by those skilled in the art without the description of these details.

The present disclosure is described in detail by giving examples with reference to the drawings. It should be noted that the drawings are simplified and do not use an accurate proportion, that is, the drawings are for the objectives of conveniently and clearly assisting in illustrating embodiments of the present disclosure.

In an embodiment of the present disclosure, a GaN power transistor is used in a switching circuit as a main power transistor. A controller is configured to control an on-off state of the main power transistor. A power supply terminal of the controller is connected with a drain of the main power transistor. The GaN power transistor and the controller are integrated in a chip. A common connection terminal of the controller and the GaN power transistor is used as a drain of the chip, that is, a drain terminal of the chip. A current flowing from the power supply terminal of the controller to the drain of the main power transistor and a current flowing from a source of the main power transistor to its drain are defined herein as a negative current, and the power supply terminal of the controller is an input terminal of a high-voltage power supply of the controller. The current limiting circuit of the present disclosure limits the current flowing out of the power supply terminal of the controller, that is, limits the current flowing to the drain of the main power transistor.

Figure 1:
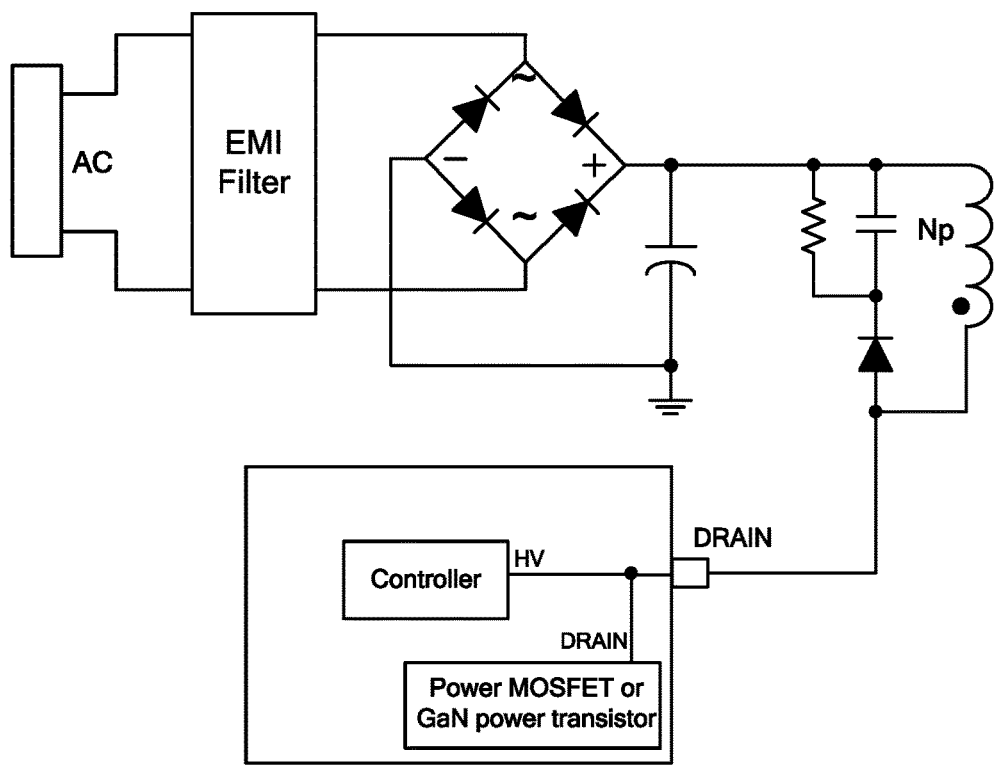
FIG. 1 is a schematic diagram of a switching circuit based on a metal-oxide-semiconductor (MOS) transistor in the prior art.
Figure 2:
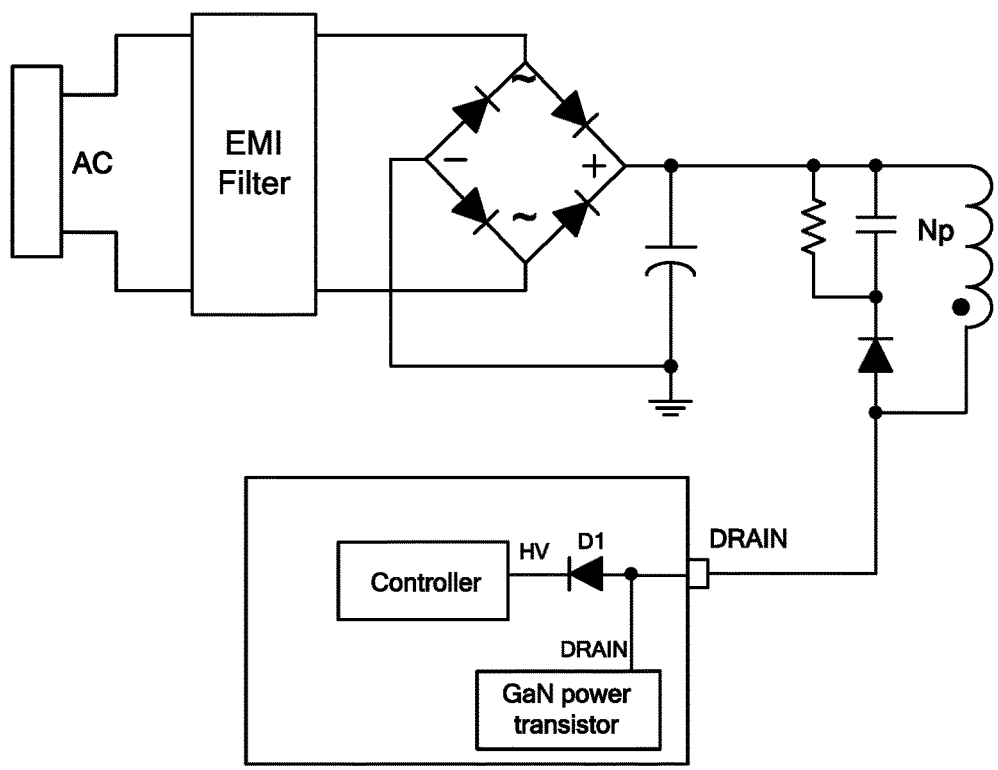
FIG. 2 is a schematic diagram of a switching circuit using Embodiment I of a current limiting circuit according to the present disclosure.

As shown in FIG. 2, a schematic diagram of a switching circuit using Embodiment I of a current limiting circuit according to the present disclosure is illustrated. The current limiting circuit includes a diode D1. In order to ensure safe operation of the circuit, the diode D1 is usually configured as a high-voltage diode. The high-voltage diode D1 includes an anode connected with the drain of the GaN power transistor, and a cathode connected with the power supply terminal of the controller of the switching circuit. When the drain terminal of the GaN power transistor is under a negative voltage, the diode D1 is off, and the current is blocked from flowing out of the power supply terminal of the controller by the diode D1, so as to ensure normal and safe operation of the controller.

Figure 3:
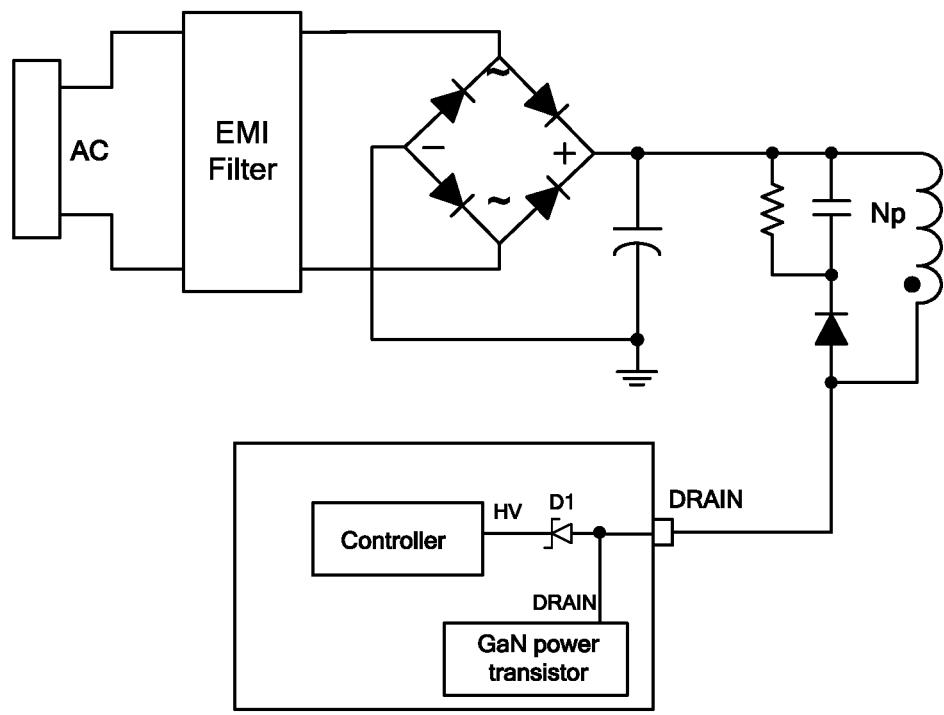
FIG. 3 is a schematic diagram of a switching circuit using Embodiment II of the current limiting circuit according to the present disclosure.

As shown in FIG. 3, a schematic diagram of a switching circuit using Embodiment II of the current limiting circuit according to the present disclosure is illustrated. The current limiting circuit includes a zener diode D1. The zener diode D1 includes an anode connected with the drain of the GaN power transistor, and a cathode connected with the power supply terminal of the controller of the switching circuit. A breakdown voltage of the zener diode is greater than an absolute value of a drain-source voltage difference of the main power transistor when a negative current flows through the main power transistor. When there is a negative current in the system, the breakdown voltage of the zener diode D1 is greater than a source-drain voltage of the GaN power transistor, the zener diode will not be broken down, so that the zener diode blocks the current from flowing out of the power supply terminal of the controller, to ensure normal and safe operation of the controller.

Figure 4:
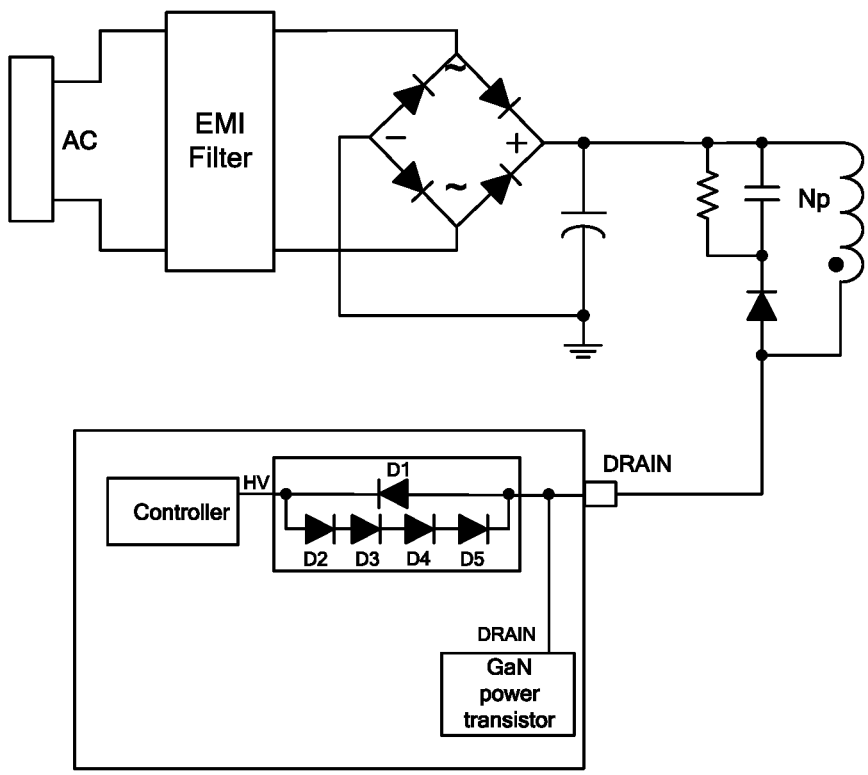
FIG. 4 is a schematic diagram of a switching circuit using Embodiment III of the current limiting circuit according to the present disclosure.

As shown in FIG. 4, a schematic diagram of a switching circuit using Embodiment III of the current limiting circuit according to the present disclosure is illustrated. The connection relationship of the switching circuit is the similar to that in Embodiment I. However, the current limiting circuit includes a main diode D1 and a plurality of auxiliary diodes. The main diode includes an anode connected with the drain of the GaN power transistor, and a cathode connected with the power supply terminal of the controller. The plurality of auxiliary diodes are connected in series and then connected in anti-parallel with the main diode. The function of a string of the auxiliary diode is that when the drain voltage of the GaN power transistor varies from high to low, a withstand voltage bore by the main diode D1 may just be a sum of voltage drops Vf of a string of the auxiliary diodes, such that a low-voltage diode can be selected as the main diode D1.

In one embodiment, the number of a string of the auxiliary diodes is also determined by a source-drain voltage Vsd of the GaN power transistor. When there is a negative current in the system, the sum of the voltage drops Vf of a string of the auxiliary diodes is greater than the source-drain voltage Vsd of the GaN power transistor, such that when there is a negative current in the system, current always flows through the GaN power transistor, but no current will flow out of the power supply terminal of the controller, so as to ensure normal operation of the controller. Through this method, a low-voltage diode can be selected as the mentioned diode in every circumstance, which is convenient for design.

Figure 5:
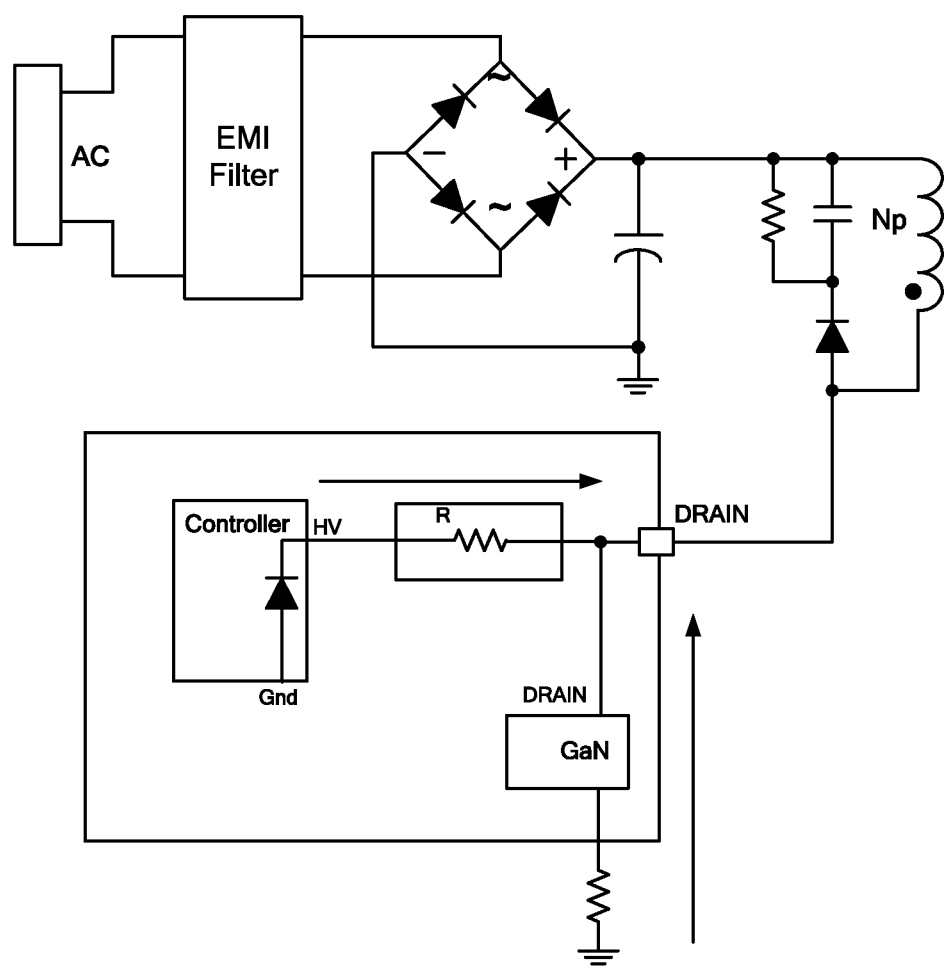
FIG. 5 is a schematic diagram of a switching circuit using Embodiment IV of the current limiting circuit according to the present disclosure.

As shown in FIG. 5, a schematic diagram of a switching circuit using Embodiment IV of the current limiting circuit according to the present disclosure is illustrated. The current limiting circuit includes a first resistor. A resistor is connected in series between the drain pin of the chip and the high-voltage (HV) input terminal of the controller, that is, the power supply terminal. When there is a reverse current in the system, for example, the voltage of the drain pin is about −2 V, an electrostatic discharge (ESD) diode of the HV input terminal of the controller to the ground is turned on, and the voltage at the HV input terminal is the voltage drop of the ESD diode, about 0.7 V. The voltage at the HV input terminal is negative at this time, however, through limiting the current of the resistor R connected in series, the majority of the reverse current of the system flows through the path where the GaN power transistor is located, and the reverse current flowing through the controller is only (2-0.7 V)/R. Usually the resistor R is a few k ohms, which does not affect normal high-voltage start-up charging. At the same time, the negative current of the controller may be effectively suppressed, and the negative voltage at the HV input terminal may also be limited, which is only about −0.7 V.

Although the embodiments are separately illustrated and described above, the embodiments contain some common technologies. Those skilled in the art can replace and integrate the embodiments. Any content not clearly recorded in one of the embodiments may be determined based on another embodiment where the content is recorded.

The embodiments described above do not constitute a limitation on the scope of protection of the technical solution of the present disclosure. Any modification, equivalent replacement, and improvement made within the spirit and principle of the above-mentioned embodiments shall fall within the scope of protection of the technical solution of the present disclosure.

What is claimed is:

1. A current limiting circuit of a switching circuit, wherein the switching circuit comprises a main power transistor and a controller, a power supply terminal of the controller is connected with a drain of the main power transistor, and the current limiting circuit comprises a first terminal connected with the drain of the main power transistor, and a second terminal connected with the power supply terminal of the controller, wherein the main power transistor is configured as a gallium nitride (GaN) power transistor and the first terminal of the current limiting circuit is coupled to a connection terminal between the drain of the main power transistor and a drain of a chip into which the controller and the main power transistor are integrated.

2. The current limiting circuit according to claim 1, comprising a diode, wherein the diode comprises an anode connected with the drain of the main power transistor, and a cathode connected with the power supply terminal of the controller.

3. The current limiting circuit according to claim 1, comprising a zener diode, wherein the zener diode comprises an anode connected with the drain of the main power transistor, and a cathode connected with the power supply terminal of the controller.

4. The current limiting circuit according to claim 3, wherein a breakdown voltage of the zener diode is greater than an absolute value of a drain-source voltage difference of the main power transistor when a negative current flows through the main power transistor.

5. The current limiting circuit according to claim 1, comprising a main diode and a plurality of auxiliary diodes, wherein the main diode comprises an anode connected with the drain of the main power transistor, and a cathode connected with the power supply terminal of the controller; and the plurality of auxiliary diodes are connected in anti-parallel with the main diode after the plurality of auxiliary diodes are connected in series.

6. The current limiting circuit according to claim 5, wherein a number of the plurality of auxiliary diodes is determined according to a source-drain voltage of the main power transistor.

7. The current limiting circuit according to claim 5, wherein a total voltage drop of the plurality of auxiliary diodes in series is greater than an absolute value of a drain-source voltage difference of the main power transistor when a negative current flows through the main power transistor.

8. The current limiting circuit according to claim 1, comprising a first resistor, wherein the first resistor comprises a first terminal connected with the drain of the main power transistor, and a second terminal connected with the power supply terminal of the controller.

9. A switching circuit, comprising a main power transistor and a controller, wherein a power supply terminal of the controller is connected with a drain of the main power transistor, and the switching circuit comprises the current limiting circuit according to claim 1.

10. The switching circuit according to claim 9, wherein a common connection point of the power supply terminal of the controller and the drain of the main power transistor is connected to a power loop node of the switching circuit.

11. The switching circuit according to claim 1, wherein the current limiting circuit comprises a diode, wherein the diode comprises an anode connected with the drain of the main power transistor, and a cathode connected with the power supply terminal of the controller.

12. The switching circuit according to claim 1, wherein the current limiting circuit comprises a zener diode, wherein the zener diode comprises an anode connected with the drain of the main power transistor, and a cathode connected with the power supply terminal of the controller.

13. The switching circuit according to claim 12, wherein a breakdown voltage of the zener diode is greater than an absolute value of a drain-source voltage difference of the main power transistor when a negative current flows through the main power transistor.

14. The switching circuit according to claim 1, wherein the current limiting circuit comprises a main diode and a plurality of auxiliary diodes, wherein the main diode comprises an anode connected with the drain of the main power transistor, and a cathode connected with the power supply terminal of the controller; and the plurality of auxiliary diodes are connected in anti-parallel with the main diode after the plurality of auxiliary diodes are connected in series.

15. The switching circuit according to claim 14, wherein a number of the plurality of auxiliary diodes is determined according to a source-drain voltage of the main power transistor.

16. The switching circuit according to claim 14, wherein a total voltage drop of the plurality of auxiliary diodes in series is greater than an absolute value of a drain-source voltage difference of the main power transistor when a negative current flows through the main power transistor.

17. The switching circuit according to claim 1, wherein the current limiting circuit comprises a first resistor, wherein the first resistor comprises a first terminal connected with the drain of the main power transistor, and a second terminal connected with the power supply terminal of the controller.

* * * * *